(12) United States Patent  
Loyer et al.

(10) Patent No.: US 7,946,690 B2
(45) Date of Patent: May 24, 2011

(54) PRINTHEAD FABRICATED ON FLEXIBLE SUBSTRATE

(75) Inventors: Daniel W. Loyer, San Clemente, CA (US); Henry Roskos, Los Gatos, CA (US); Bruce Hammond, Castro Valley, CA (US)

(73) Assignee: MVM Technologies, Inc., San Clemente, CA (US)

( * ) Notice: Subject to any disclaimer, the term of this patent is extended or adjusted under 35 U.S.C. 154(b) by 254 days.

(21) Appl. No.: 12/033,242

(22) Filed: Feb. 19, 2008

(65) Prior Publication Data

US 2008/0198205 A1 Aug. 21, 2008

Related U.S. Application Data

(60) Provisional application No. 60/890,814, filed on Feb. 20, 2007, provisional application No. 60/980,545, filed on Oct. 17, 2007.

(51) Int. Cl.
  *B41J 2/045* (2006.01)
(52) U.S. Cl. .......................................... 347/72
(58) Field of Classification Search .................. 347/68, 347/72, 70, 71, 69
  See application file for complete search history.

(56) References Cited

U.S. PATENT DOCUMENTS

| | | | |
|---|---|---|---|
| 590,988 A | 10/1897 | Hughes | |
| 4,617,581 A * | 10/1986 | Koto et al. | 347/71 |
| 5,846,615 A | 12/1998 | Sharma et al. | |
| 5,894,038 A | 4/1999 | Sharma et al. | |
| 5,980,813 A | 11/1999 | Narang et al. | |
| 6,548,122 B1 | 4/2003 | Sharma et al. | |
| 6,796,637 B2 * | 9/2004 | Kitagawa et al. | 347/68 |
| 6,991,876 B2 | 1/2006 | Narang et al. | |
| 2004/0091774 A1 | 5/2004 | Narang et al. | |
| 2004/0232805 A1 | 11/2004 | Ebigase et al. | |
| 2005/0243141 A1 | 11/2005 | Shaarawi et al. | |
| 2006/0011544 A1 | 1/2006 | Sharma et al. | |
| 2006/0012645 A1 | 1/2006 | Nagashima | |
| 2006/0250667 A1 | 11/2006 | Loyer et al. | |
| 2008/0012908 A1 | 1/2008 | Takeda et al. | |

FOREIGN PATENT DOCUMENTS

WO WO 2004018214 A1 * 3/2004
WO 2007/016237 2/2007

* cited by examiner

*Primary Examiner* — Matthew Luu
*Assistant Examiner* — Lisa M Solomon
(74) *Attorney, Agent, or Firm* — Fish & Associates, PC

(57) ABSTRACT

A printhead or other droplet emitter is manufactured integrally with a flexible circuit. Preferred methods of manufacturing a droplet emitter comprise the steps of: creating metal traces, preferably deposited using a metal oxide precursor; patterning a sacrificial photoresist to create ink channels and nozzle chambers; depositing piezoelectrically active material over the metal traces and sacrificial photoresist; patterning vias through the piezo-electrically active material to act as nozzles and openings to ink reservoirs; and flushing out the photoresist. The piezo-electrically active material is preferably a mixture of PZT and PVDF.

13 Claims, 13 Drawing Sheets

– 1 –

PRINTHEAD FABRICATED ON FLEXIBLE SUBSTRATE

This application claims priority to U.S. provisional application ser. no. 60/890814 filed Feb. 20, 2007, and U.S. provisional application ser. no. 60/980545 filed Oct. 17, 2007.

FIELD OF THE INVENTION

The field of the invention is printheads. (class 438)

BACKGROUND

Conventionally, printheads and other droplet emitters have always been manufactured separately from the control circuitry. Printheads or droplet emitters are then aligned or affixed to the circuitry during manufacturing to produce a commercial product. Unfortunately, as density or fineness increases, the number of connections between the printhead and the circuitry rises to such an extent that proper alignment incurs a high manufacturing cost overhead. Indeed, the cost is so high that that Epson™, Cannon™ and other manufacturers are forced to sell the printhead as part of the printer rather than as part of the disposable cartridge.

HP™, Lexmark™, and Dell™ address this problem differently, by including a multiplexing circuit inside the printhead. This reduces the number of lines to be connected from over 400 to less than about 60, which is sufficiently low to allow inclusion within the printhead in a disposable ink cartridge. But then the ink cartridge is quite expensive.

What is needed is an inexpensive way of manufacturing low cost printheads (and other fine droplet emitters), where the printhead can be produced as part of the control circuitry. Here, however, a problem arises where the circuitry needs to be flexible. Many embodiments of flex-circuits are known, but they are not readily available with sufficiently fine lines to integrate with a printhead.

There are entirely additive technologies for printing fine lines on polyimide (e.g., Kapton™) or other flexible substrates. Descriptions of various aspects of that technology are set forth in U.S. Pat. No. 6,991,876, U.S. Pat. No. 6,548,122, U.S. Pat. No. 590,988, U.S. Pat. No. 5,846,615, U.S. Pat. No. 5,894,038, U.S. Pat. No. 5,980,813, US2006/0011544, US2004/0091774. These and all other extraneous materials discussed herein are incorporated by reference in their entirety. Where a definition or use of a term in an incorporated reference is inconsistent or contrary to the definition of that term provided herein, the definition of that term provided herein applies and the definition of that term in the reference does not apply.

It has not, however, been appreciated that those techniques can be used advantageously to produce flexible circuit and printhead portions of an integrated device.

SUMMARY OF THE INVENTION

The present invention provides systems and methods in which a printhead or other droplet emitter is manufactured integrally with a flexible circuit. As used herein, the term "flexible" includes semi-flexible.

In preferred embodiments the emitter is formed as an inkjet printhead, by employing fluid paths and nozzles spaced to accommodate printing on paper.

Preferred devices have conductive traces additively formed onto a polyimide or other flexible substrate. The traces are preferably pure metal, such as can be deposited by reducing a metal oxide. The traces provide electrical energy to a plurality of piezoelectric elements, which can be advantageously comprise a mixture of PZT and PVDF, but which can alternatively comprise other materials, including PVT or other ceramics.

Preferred methods of manufacturing a droplet emitter comprise the steps of: creating metal traces; patterning a sacrificial photoresist to create ink channels and nozzle chambers; depositing piezoelectrically active material over the metal traces and sacrificial photoresist; patterning vias through the flexible substrate to act as nozzles and through the piezoelectrically active material for openings to ink reservoirs; and flushing out the photoresist.

Various objects, features, aspects and advantages of the inventive subject matter will become more apparent from the following detailed description of preferred embodiments, along with the accompanying drawings in which like numerals represent like components.

DETAILED DESCRIPTION

Figure 1A:
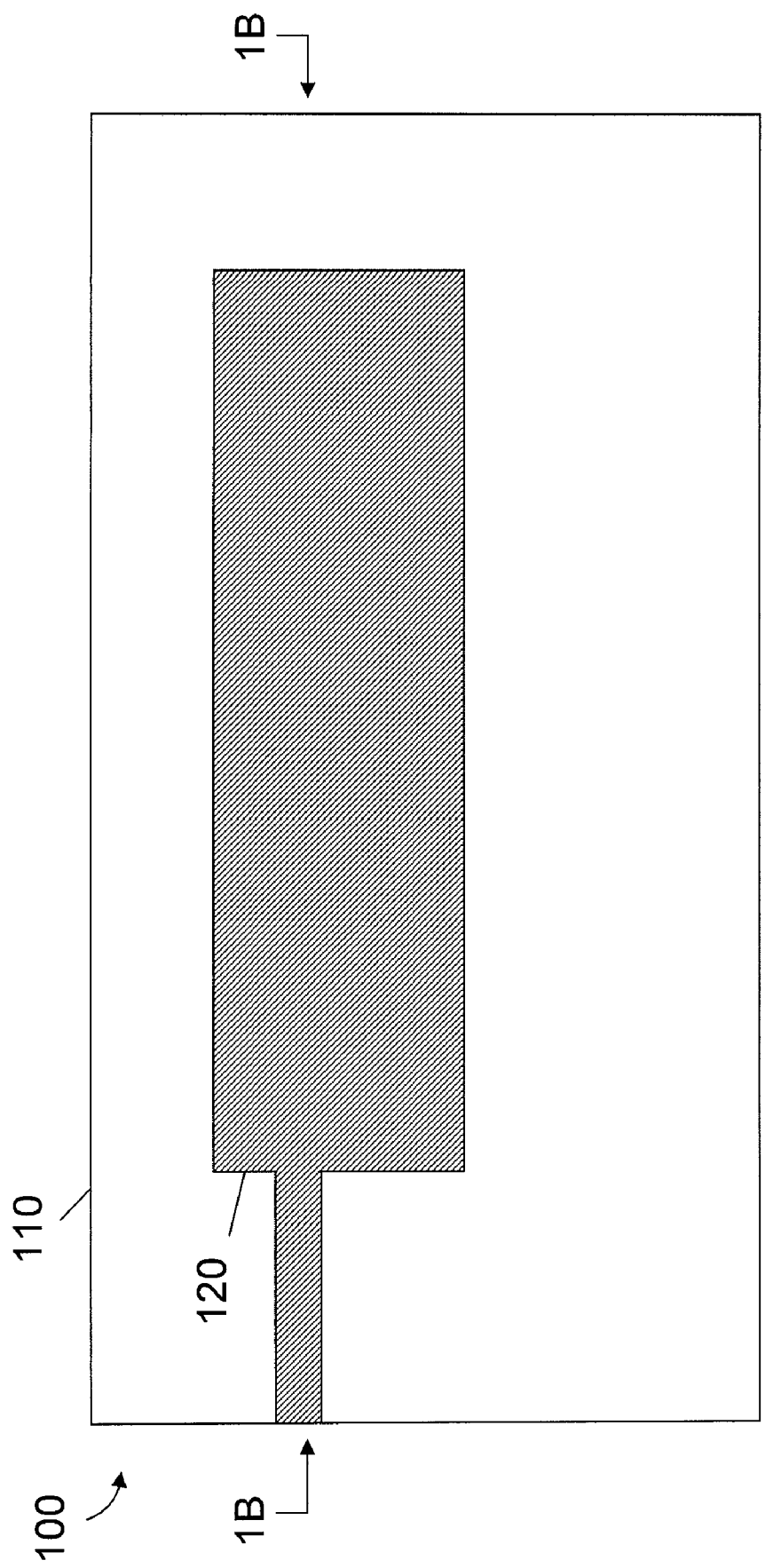
FIG. 1A is a plan view of a portion of a partially formed printhead, with a lower conductive trace having been applied to a flexible substrate.
Figure 1B:
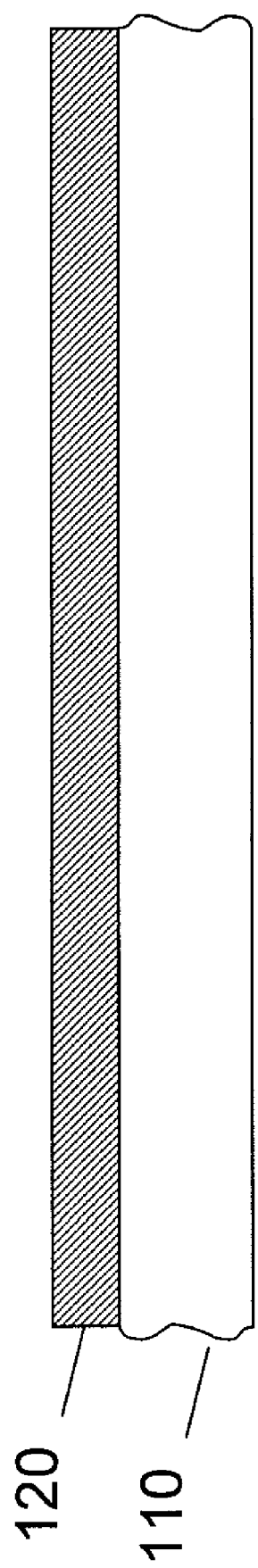
FIG. 1B is a side view of the partially formed printhead of FIG. 1A taken along plane 1B-1B.

FIGS. 1A and 1B generally show a partially formed printhead, with a lower conductive trace 120 having been applied to a flexible substrate 110.

The flexible substrate 110 is preferably Kapton™ or other polyimide, although any material will suffice that has suitable flexibility and durability, and can accept or be made to accept an electrically conducting trace. Suitable thicknesses range from 25μ to 250μ. Unless the context dictates otherwise, all ranges herein should be read as including their endpoints.

Traces can be formed in any suitable manner, but are preferably formed as a seed layer of printed metal oxide that is subsequently reduced to form a pure metal or an alloy. Such processes are taught in U.S. Pat. No. 6,548,122 (Sharma, 2003). The seed layer of metal, preferably pure copper, is likely very thin, perhaps no more than 1μ. However, once the seed layer is in place, the trace can be built up in by electroplating or other additive manner known in the art.

Preferred traces are about 0.3μ-3μ, and more preferred traces are about 0.5μ to 1μ thick; and about 5μ-50μ wide at a narrow edge portion (far left in FIG. 1A) which will connect to a driver circuit (not shown). The lower trace 120 will cooperate with an upper trace (see FIGS. 4A, 4B, 5A, and 5B) to impose a voltage or an electric field on a portion of elastomer 140 (see FIGS. 3A, 3B, 4A, 4B, 5A, and 5B), and therefore is disposed in an area of greater width (x, y plane) to the right of the narrow edge portion.

Figure 2A:
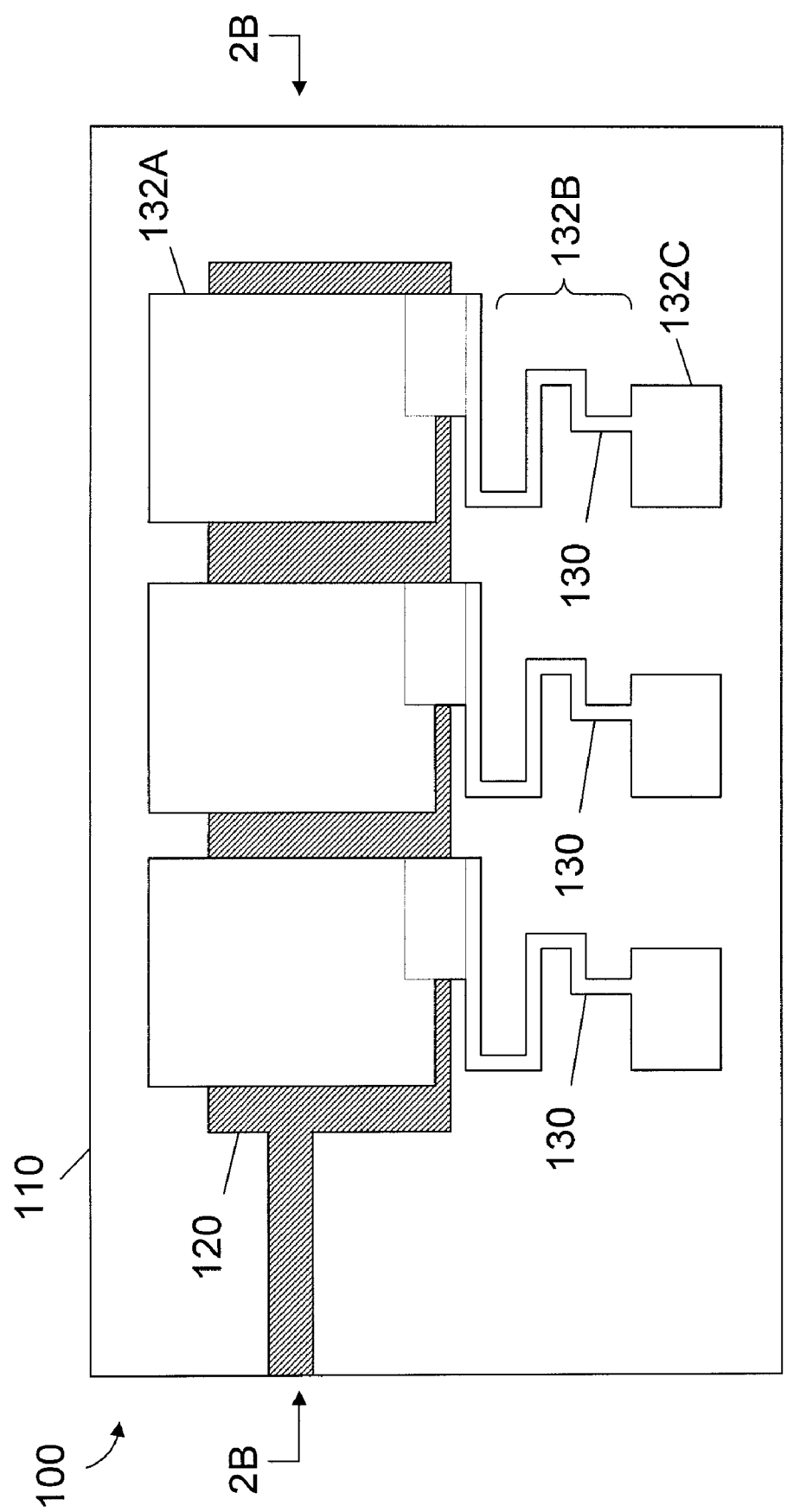
FIG. 2A is a plan view of a portion of the partially formed printhead of FIG. 1A, to which has been added a sacrificial photoresist.
Figure 2B:
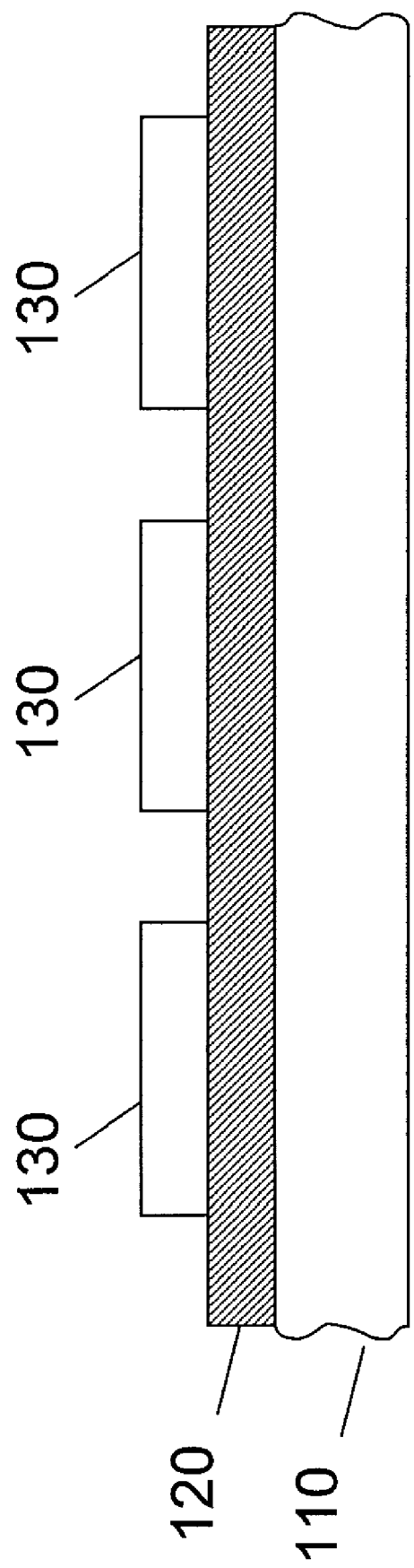
FIG. 2B is a section of the printhead of FIG. 2A taken along plane 2B-2B.

FIGS. 2A and 2B show an addition of a patterned sacrificial photoresist 130. The photoresist will be washed away later in the processing to provide a fluid ink channel, which would be for ink in the case of an ink jet printer, but could any other liquid, or indeed any material that flows. In this case the channels formed by photoresist 130 have three portions, a first portion, chamber 130A that receives fluid from a main reservoir and that acts as a mini local reservoir, a second portion, tortuous fluid line 130B that increases flow resistance to help prevent backflow, and a third portion, actuating chamber 130C that acts as a bellows, pulling fluid in from first and second portions 130A, 130B, and expelling it out through nozzle 132 (see FIGS. 5A, and 5B). One very important advantage of the contemplated emitters is that by choosing appropriate dimensions for photoresist 130, the relaxation (e.g., inter-pulse) time can be reduced to about 25 nsec, as opposed to about 50 nsec in the prior art.

One should appreciate that the contemplated elastomers can typically deform by 20% to 30% with respect to its thickness when under a voltage or an electric field as opposed to a few tenths of a percent for traditional piezo-electric material. Employing such high mobility elastomers allows for reducing the volume of chambers while retaining the size of desired ink droplets.

One should also note that by reversing the voltage, the elastomer can be forced to relax as opposed to allowing the elastomer to relax naturally through a normal hysteresis cycle. Such an approach provides for faster cycle times which result in higher print speeds.

Dimensions of the photoresist 130 will depend mostly on the viscosity and other characteristics of the intended fluid. For ink-jet printers, the photoresist 130 would likely have a height of between 15μ-50μ, and the volumes of the smaller and larger chambers 130A, 130C would likely be 100,000μ$^3$-4,000,000μ$^3$. Fluid line 130B would likely have a cross-section of 625μ$^2$-3,000μ$^2$. The length of the chambers can be significantly reduced over prior art printheads.

The photoresist 130 can be applied in any suitable manner. Standard spin-on techniques are considered to be adequate, although all suitable methods are contemplated. Washing out of photoresist 130 can also be accomplished in any suitable manner, although preferably using standard techniques.

Figure 3A:
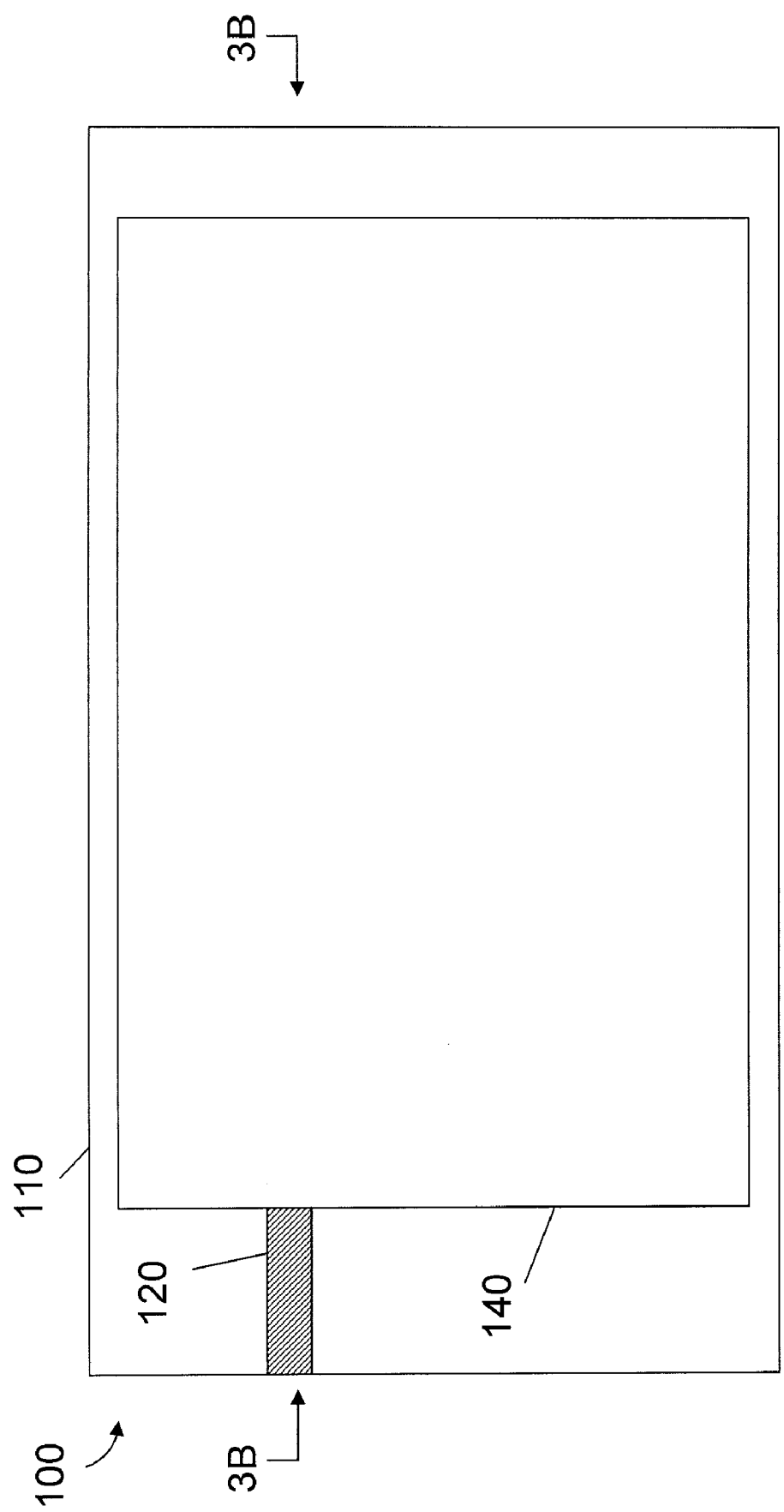
FIG. 3A is a plan view of a portion of the partially formed printhead of FIG. 2A, to which has been added a layer of piezo-electrically active material.
Figure 3B:
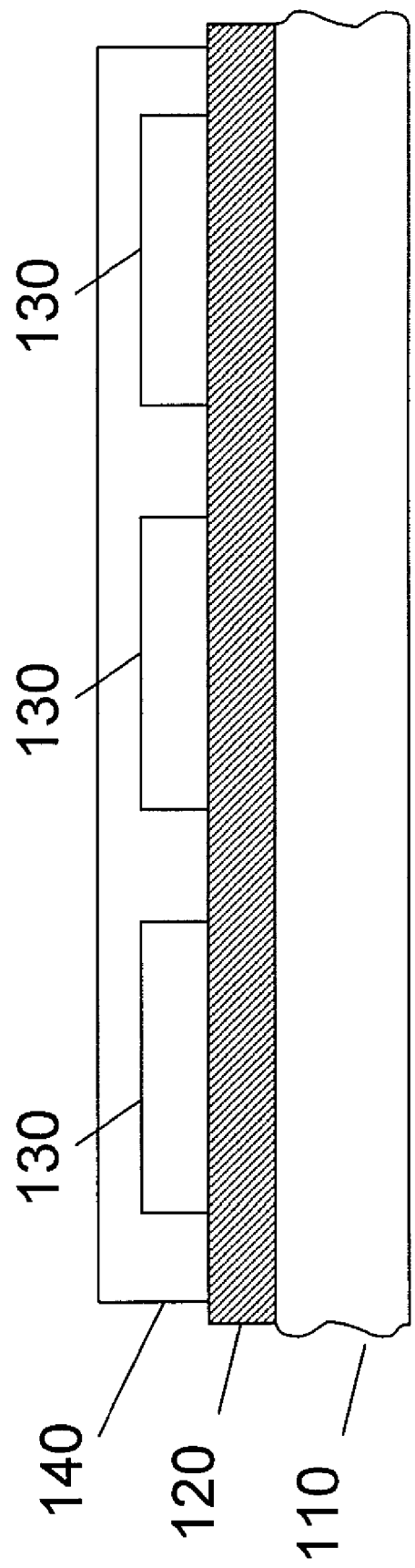
FIG. 3B is a section of the printhead of FIG. 3A taken along plane 3B-3B.

In FIGS. 3A and 3B a piezoelectrically active elastomer 140 has been placed over the top of most of the conductive trace 120, and the photoresist 130. Preferred elastomers are chlorobutate, polyisoprene, and polycholoroprene, PZT (lead-zirconium-titanium), PVDF (polyvinylidene difluoride), PVA (polyvinyl acetate) and PZT/PVDF combinations. Preferred elastomers are do not requiring poling, are very flexible, and cure at low temperature, e.g., 125 to 400° C. Currently, the most preferred elastomer is 96 wt % PZT and 4 wt % PVDF. The elastomer(s) is/are deposited to a thickness of 1.5μ-5μ as deposited prior to curing using conventional techniques.

It is important to appreciate that the elastomer 140 forms at least part of the individual valve units. In this particular example the material forms the roof for the mini-reservoirs 130A, the backflow attenuators 130B, the actuating chambers 130C, and the nozzles 132.

Figure 4A:
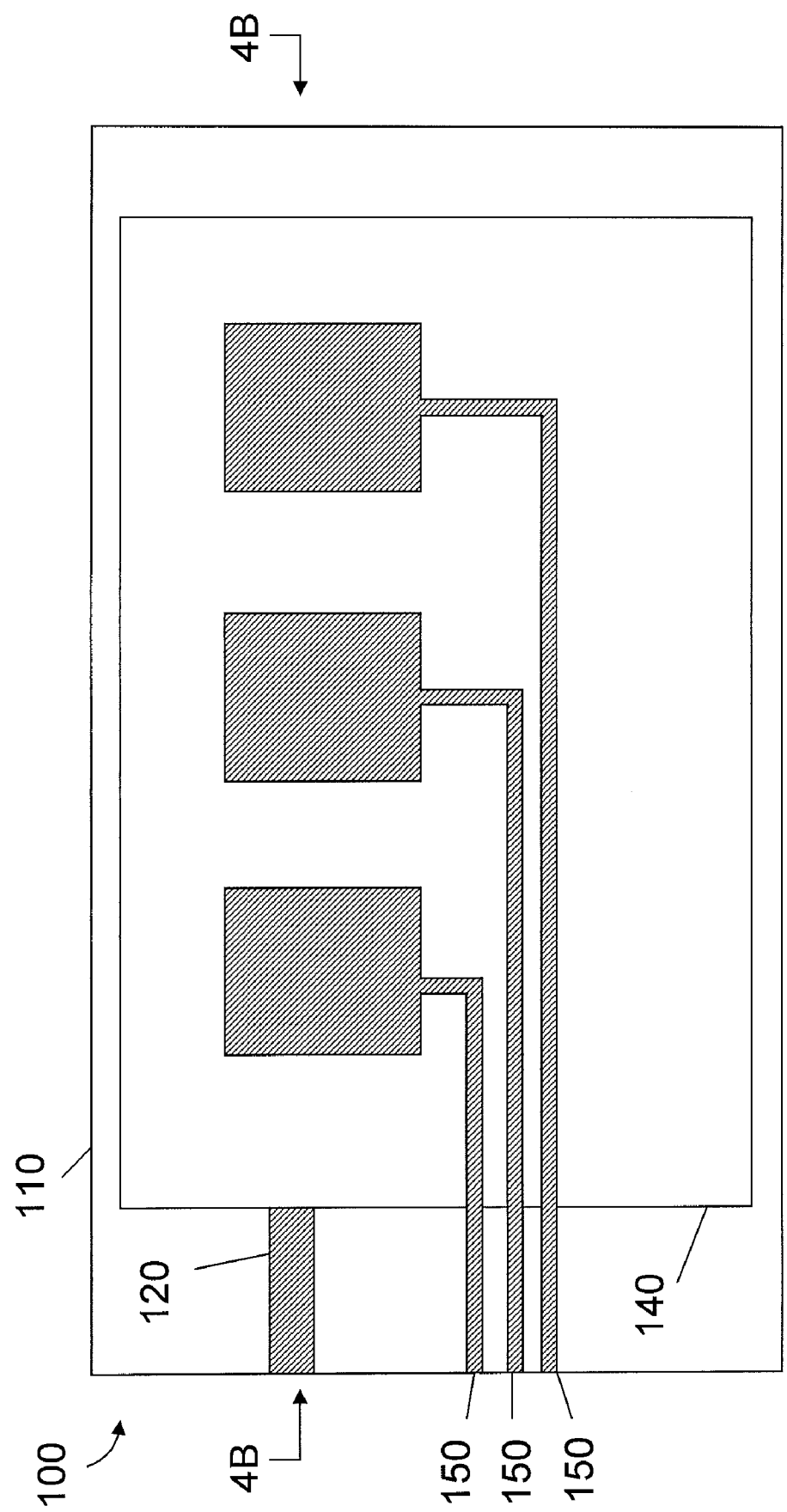
FIG. 4A is a plan view of a portion of the partially formed printhead of FIG. 3A, to which has been added an upper conductive trace.
Figure 4B:
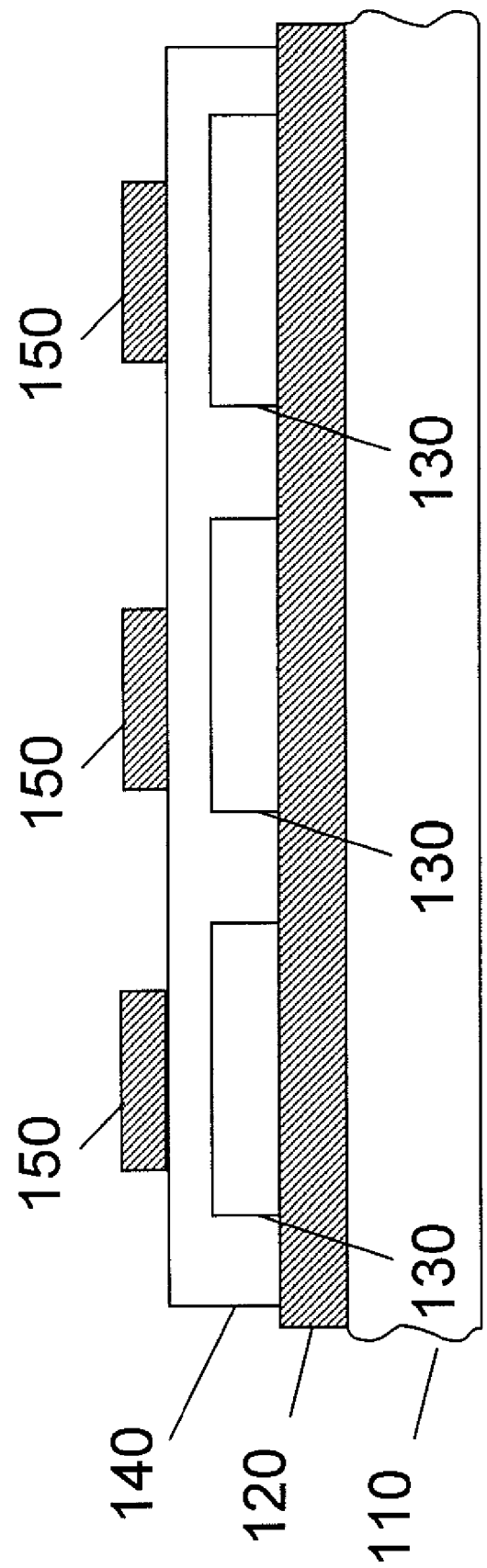
FIG. 4B is a section of the printhead of FIG. 4A taken along plane 4B-4B.

In FIGS. 4A and 4B, a plurality of upper conductive traces 150 are deposited on top of the elastomer 140, and extending over the flexible substrate 110. Each upper trace 150 is shown as being positioned above a corresponding actuating chamber 130C, and in this arrangement each chamber 130C can then be actuated independently. It should be appreciated that a given upper trace 150 could lead to multiple pads associated with different actuating chambers. Upper traces 150 can be formed in any suitable manner, but are preferably formed using the same technology as that used to form lower traces 120.

As used herein, the terms "lower trace" and "upper trace" refer to relative positions with respect to the actuating chambers 130C. Obviously, both lower traces 120 and upper traces 150 can lie at the same plane (far left of FIGS. 1A, 2A, 3A, 4A, and 5A) to interface with a driver circuit. It should also be appreciated that although the drawing figures are not drawn rigorously to scale, they are drawn with rough approximations as to scale. Thus, one can see that in the embodiment of FIG. 4A, the circuit connection portions (far left) of traces 150 are likely to be narrower that that of lower trace 120.

Figure 5A:
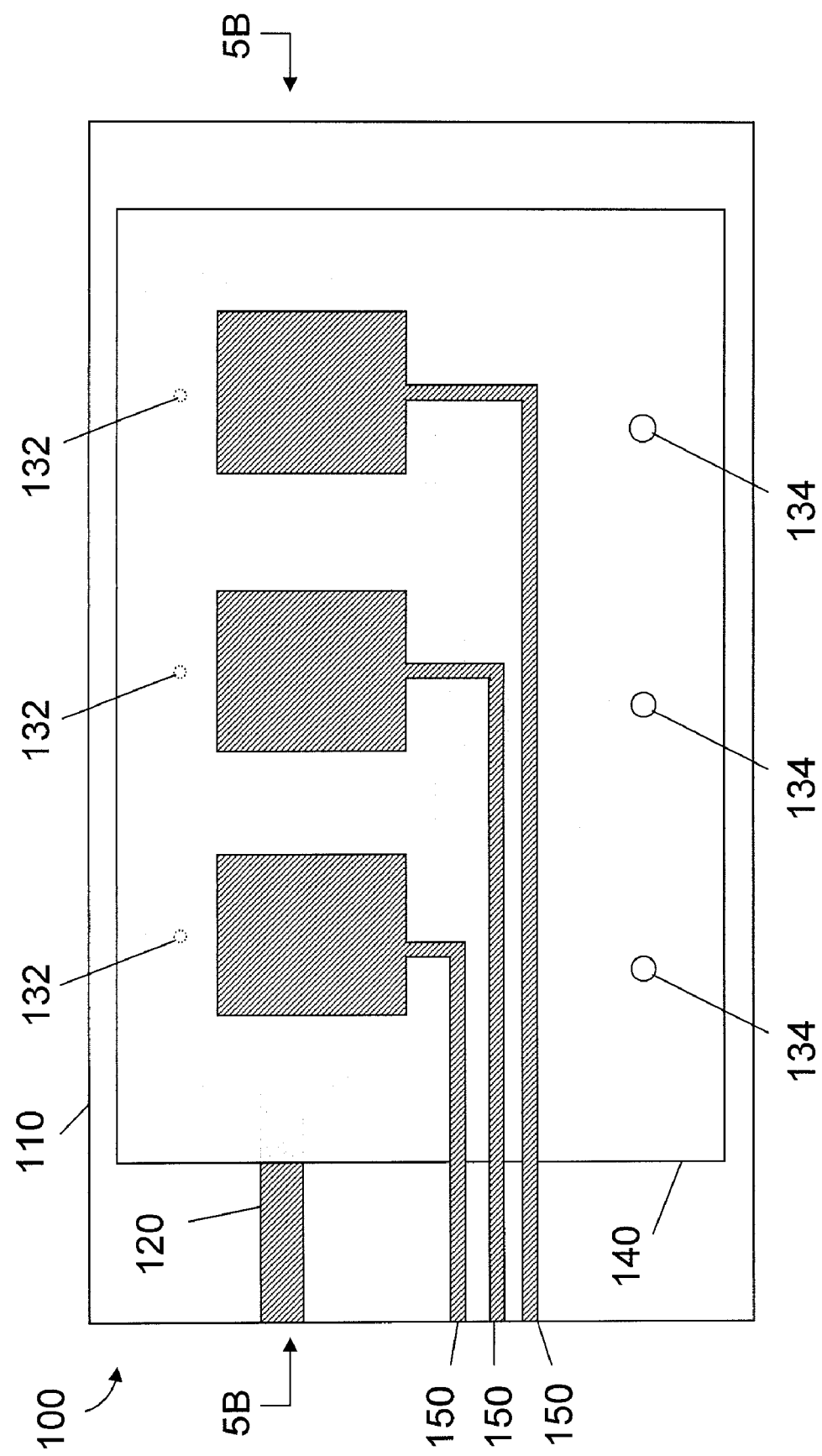
FIG. 5A is a plan view of a portion of the partially formed printhead of FIG. 4A, to which has been added nozzles and through holes to a reservoir.
Figure 5B:
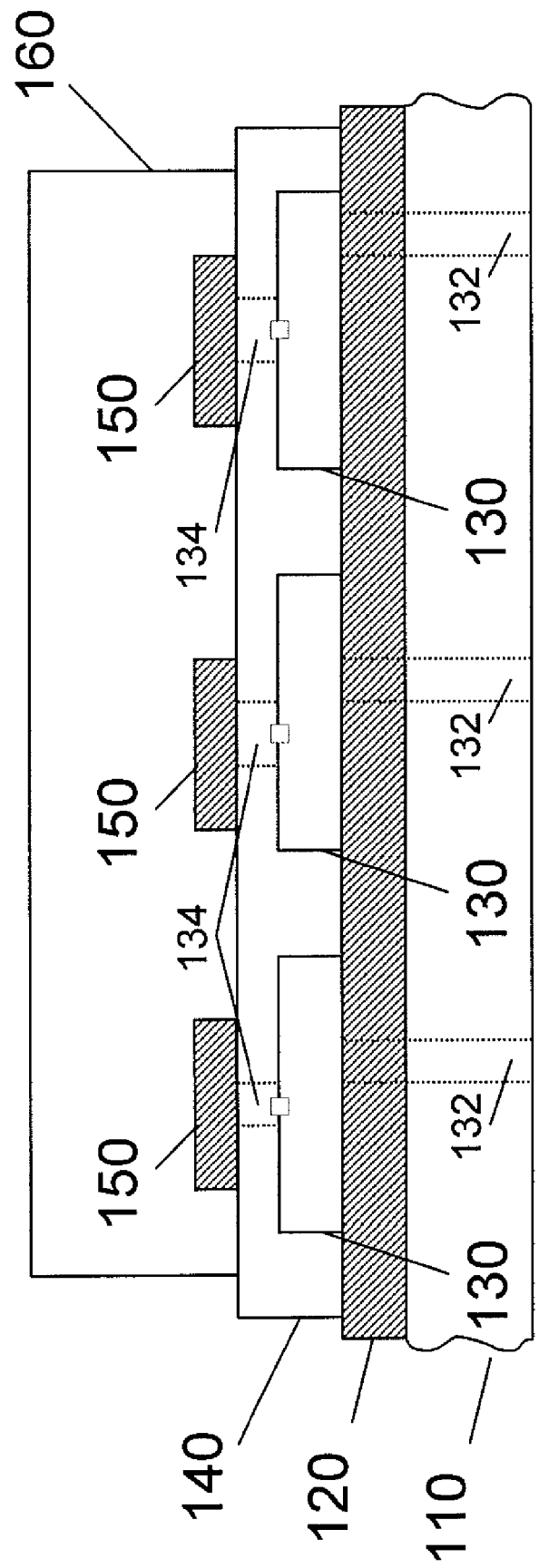
FIG. 5B is a section of the printhead of FIG. 5A taken along plane 5B-5B.

In FIGS. 5A and 5B nozzles 132 are essentially opening vias that have been patterned preferably through flexible substrate 110, and into the actuating chamber 130C. Such patterning is within the ordinary skill in the art, and would typically be accomplished using a laser. The holes forming the nozzles 132 can be any suitable size and shape, once again depending largely upon the nature of the fluid being deposited. Presently preferred holes are substantially round in cross-section, and have a diameter of 15μ-45μ. The contemplated droplet emitter preferably produces droplet having sizes in the range from 5 pl to 45 pl. However, one should note that one advantage of the contemplated droplet emitters is that they can dispense individual drops in the 1-2 pl (picoliter) range.

In FIGS. 5A and 5B through holes 134 to the ink reservoir 160 (shown only in FIG. 5B) have been patterned through the elastomer 140 and into the actuating chamber 130A. Here again the holes 134 can have any suitable size and shape, and can be cut in any suitable manner.

Although only a single row containing three individual valve units is expressly shown in FIGS. 1A-5B, the various figures should be interpreted as having an arbitrarily high number of individual valve units. To that end it is expressly contemplated that a single printhead could employ from hundreds to millions of individual valve units in an array as wide as the material being printed upon. Thus, for example, a printhead could include a single cartridge printhead having hundreds of nozzles, or include a printhead spanning the width of a target printing media wherein the printhead has millions of nozzles. It is contemplated that a printhead for standard writing paper could be 8½ or 11 inches wide (20.5 or 28 cm), or in the case of printing on fabrics or carpets, could be several meters wide, or more.

One issue with having millions of individual valve units is that one must drive millions of individual conductive traces 120, 150. This is accomplished by employing multi-layered substrates providing connects to the value units, indexed addressing schemes that address valve units, or other suitable methods that control individual value units.

Figure 6:
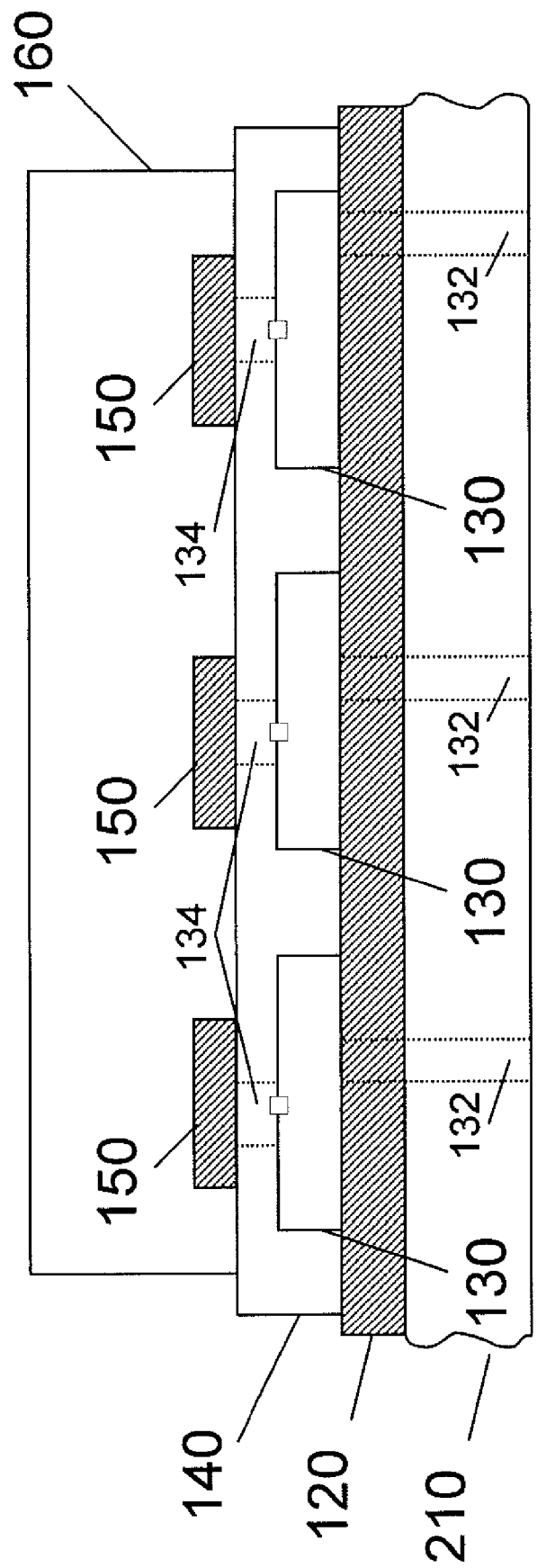
FIG. 6 is a vertical section of an alternative printhead that uses a silicon wafer as the substrate.

Embodiments are also contemplated that have much reduced flexibility. For example, in FIG. 6 a silicon wafer 210 substitutes for the polyimide substrate. The wafer 210 could be doped to provide electrical conductivity, and thereby obviate the lower traces, or lower traces 120 could be applied to the wafer 210 (as shown).

Figure 7:
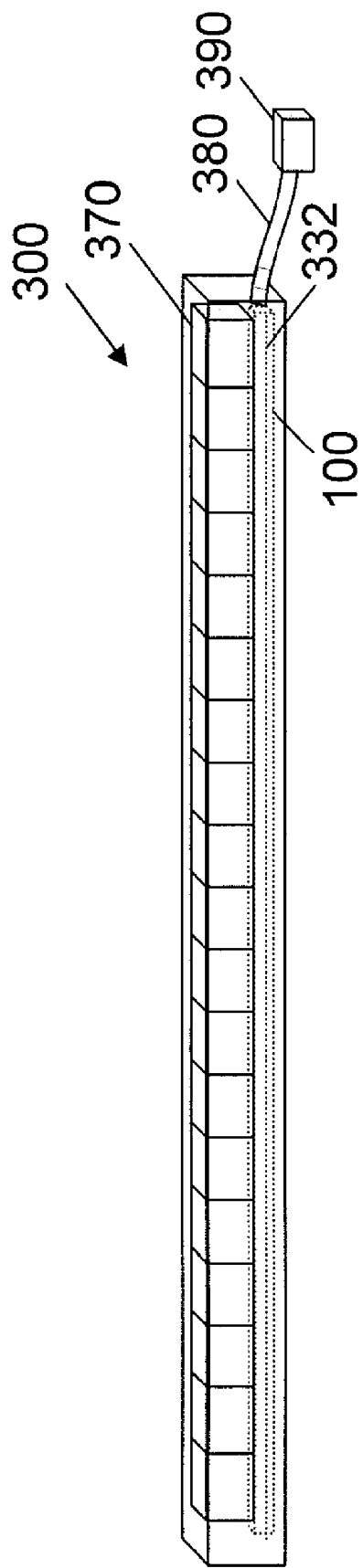
FIG. 7 is a perspective view of a printhead bar that uses 19 ink cartridges having printheads according to FIGS. 5A and 5B.

In FIG. 7 a print bar 200 uses a printhead 100 according to FIGS. 5A and 5B, and numerous ink cartridges 370, each of which contains reservoirs for various colors and black. Multiple smaller cartridges are used instead of a single large cartridge because the latter would more likely be adversely affected by tilting, and might have other fluid flow related problems. Although difficult to show at this level of detail, printhead 100 has hundreds to millions of individual valve units and corresponding nozzles 332. Cable 380 leads to a driver.

It is also expressly contemplated that printheads according to the teachings herein could advantageously be used in legacy devices, with or without a signal converter such as that taught in US 2006/0250667 (Loyer et al., 2006). In FIG. 7, a chip 390 converts thermal print signals to piezoelectric print signals.

Figure 8:
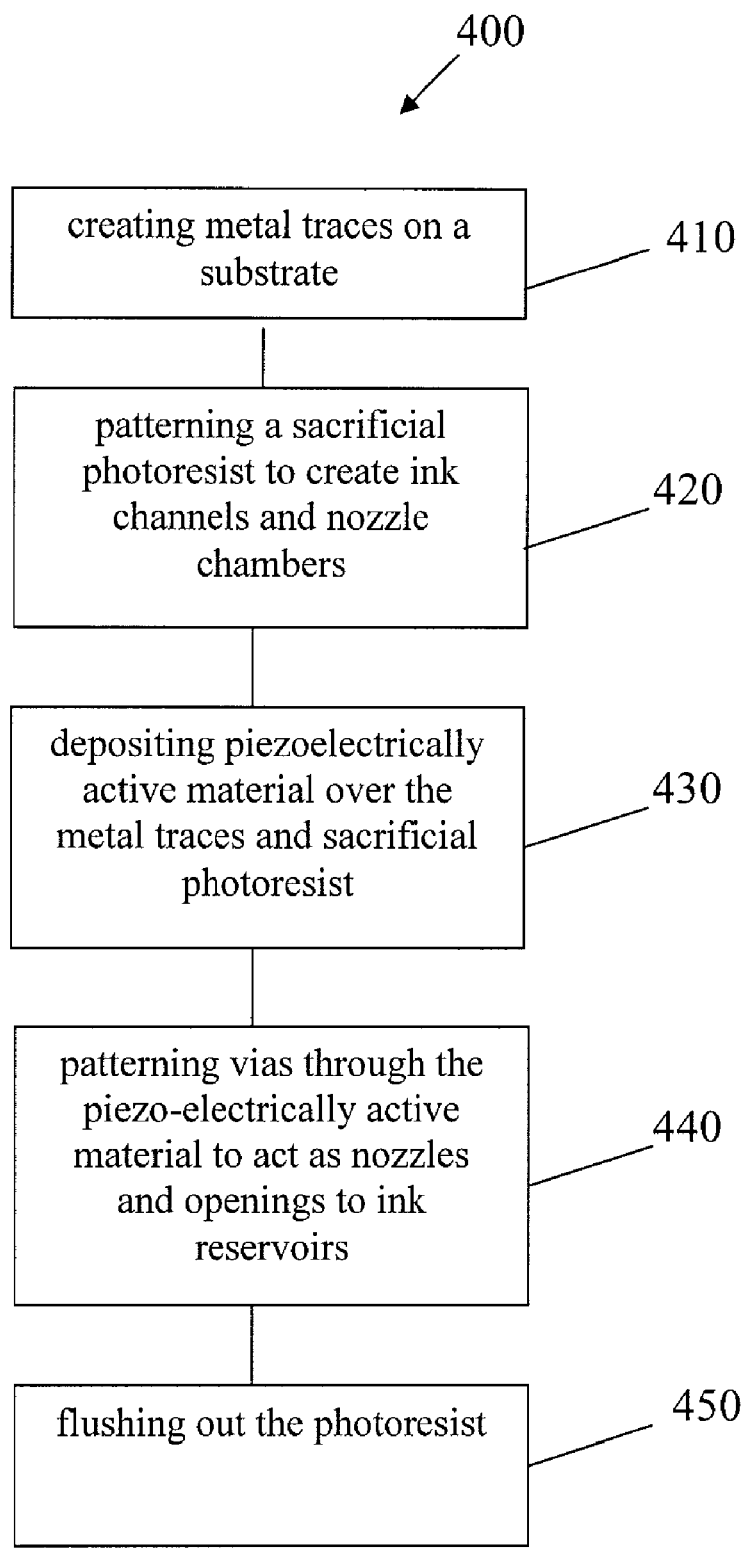
FIG. 8 is a flow chart showing preferred methods of manufacturing a droplet emitter.

In FIG. 8 preferred methods of manufacturing a droplet emitter 400 comprise the steps of: creating metal traces 410; patterning a sacrificial photoresist to create ink channels and nozzle chambers 420; depositing piezoelectrically active material over the metal traces and sacrificial photoresist 430; patterning vias through the piezo-electrically active material to act as nozzles and openings to ink reservoirs 440; and flushing out the photoresist 450. Additionally, the device can operated as a pump to aid in the removal sacrificial photoresist 430.

It should be apparent to those skilled in the art that many more modifications besides those already described are possible without departing from the inventive concepts herein. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps could be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A droplet emitter manufactured integrally with a flexible circuit comprising a flexible substrate having a nozzle through the substrate and on which is deposited a piezoelectric active material between conductive traces forming a nozzle chamber between the conductive traces and configured to emit a fluid from the chamber through the nozzle.

2. The emitter of claim 1 wherein the emitter is formed as a printhead.

3. The emitter of claim 1 wherein the emitter is formed as an inkjet printhead.

4. The emitter of claim 1, wherein the conductive traces further comprise metal traces formed onto the flexible substrate.

5. The emitter of claim 4, wherein the flexible substrate comprises a polyimide.

6. The emitter of claim 1, wherein the conductive traces form metal traces configured to provide electrical energy to a plurality of piezoelectric elements formed from the piezoelectric active material.

7. The emitter of claim 1, wherein the piezoelectric active material is coated onto at least some of the conductive traces.

8. The emitter of claim 7, wherein the piezoelectric material comprises a ceramic.

9. The emitter of claim 7, wherein the piezoelectric material comprises at least one of PZT and PVDF.

10. The emitter of claim 7, wherein the piezoelectric material comprises a mixture of PZT and PVDF.

11. The emitter of claim 7, wherein the piezoelectric material comprises an elastomer.

12. The emitter of claim 7, wherein the piezoelectric material is configured to deform by at least 20% with respect to its thickness when under a voltage.

13. The emitter of claim 1, further comprising a chip that converts thermal print signals to piezoelectric print signals.

* * * * *